United States Patent
Ho et al.

(10) Patent No.: US 7,176,559 B2
(45) Date of Patent: Feb. 13, 2007

(54) INTEGRATED CIRCUIT PACKAGE WITH A BALANCED-PART STRUCTURE

(75) Inventors: Kwun Yao Ho, Taipei (TW); Moriss Kung, Taipei (TW); Terry Ku, Taipei (TW); Andy Liao, Taipei (TW)

(73) Assignee: Via Technologies, Inc. (TW)

( * ) Notice: Subject to any disclaimer, the term of this patent is extended or adjusted under 35 U.S.C. 154(b) by 0 days.

(21) Appl. No.: 10/637,045

(22) Filed: Aug. 8, 2003

(65) Prior Publication Data
US 2005/0012189 A1   Jan. 20, 2005

(30) Foreign Application Priority Data
Aug. 16, 2002   (TW) ............... 91212735 U (51) Int. Cl.
*H01L 23/02* (2006.01)
(52) U.S. Cl. .................... 257/678; 257/686; 257/687
(58) Field of Classification Search ............. 257/678, 257/686, 687, 706, 778
See application file for complete search history.

(56) References Cited

U.S. PATENT DOCUMENTS

| | | | | |
|---|---|---|---|---|
| 5,399,898 A | * | 3/1995 | Rostoker | 257/499 |
| 5,617,297 A | * | 4/1997 | Lo et al. | 361/737 |
| 6,011,304 A | * | 1/2000 | Mertol | 257/706 |
| 6,014,317 A | * | 1/2000 | Sylvester | 361/760 |
| 6,188,578 B1 | * | 2/2001 | Lin et al. | 361/717 |
| 6,206,997 B1 | * | 3/2001 | Egitto et al. | 156/242 |
| 6,265,771 B1 | * | 7/2001 | Ference et al. | 257/706 |
| 2001/0052647 A1 | * | 12/2001 | Plepys et al. | 257/738 |
| 2004/0065473 A1 | * | 4/2004 | Chang et al. | 174/261 |
| 2004/0212066 A1 | * | 10/2004 | Wang | 257/686 |

* cited by examiner

Primary Examiner—Douglas W. Owens (57) ABSTRACT

An integrated circuit package includes a balanced-part structure. The condition of thermal stress of chips connected on a substrate decides the amount, locations, weights, and the material of at least a balanced-part fastened on a substrate. The balanced-part is fastened on the substrate to balance stress distribution before an adhering heat sinks process and a packaging molding compound process. The balanced-part also decreases thermal stress affection and avoid warpage defects of the integrated circuit packages.

5 Claims, 12 Drawing Sheets

| PACKAGING MODE | MULTI-CHIP MODULE PLASTIC BALL GRID ARRY |
|---|---|
| PACKAGE SIZE | 37.5X37.5X1.86mm |
| SUBSTRATE | 37.5X37.5X0.68mm |
| SIZE OF THE CHIP | 5.54X9.6X0.3mm(FIRST CHIP) 9.45X9.45X0.3mm(SECOND CHIP) |
| THICKNESS OF THE BOND LAYER | 0.025mm |
| VOLUME OF THE PACKAGING MOLDING COMPOUND | 36.83X36.83X1.18mm |

FIG.9

| | 1 | 2 | 3 | 4 | 5 | 6 | 7 |
|---|---|---|---|---|---|---|---|
| KIND | N/A | SILICON | SILICON | SILICON | COPPER | ALUMINUM | SILICON |
| MATERIAL OF THE BALANCED-PART | N/A | SILICON | SILICON | SILICON | COPPER | ALUMINUM | SILICON |
| SIZE OF THE BALANCED-PART | N/A | 5.08X5.08 X0.3 mm*2 | 6.35X6.35 X0.3 mm*2 | 7.62X7.62 X0.3 mm*2 | 7.62X7.62 X0.3 mm*2 | 7.62X7.62 X0.3 mm*2 | 7.62X 7.62X0. 73mm*2 |
| STACKED CHIP | N/A | N/A | N/A | N/A | N/A | N/A | N/A |
| KIND | 8 | 9 | 10 | 11 | 12 | 13 | 14 |
| MATERIAL OF THE BALANCED-PART | COPPER | ALUMINUM | COPPER | ALUMINUM | COPPER | ALUMINUM | COPPER |
| SIZE OF THE BALANCED-PART | 7.62X7.62 X0.73 mm*2 | 7.62X7.62 mm X0.73 mm *2 | 8.89X8.89 mm X0.3 mm*2 | 8.89X8.89 X0.3 mm*2 | 8.89X8.89 mm X0.73 mm *2 | 8.89X8.89 mm X0.73 mm *2 | 10.16X 10.16X0.3 mm*2 |
| STACKED CHIP | N/A | N/A | N/A | N/A | N/A | N/A | N/A |
| KIND | 15 | 16 | 17 | 18 | 19 | | |
| MATERIAL OF THE BALANCED-PART | ALUMINUM | COPPER | ALUMINUM | COPPER | ALUMINUM | | |
| SIZE OF THE BALANCED-PART | 10.16X10.16 X0.3 mm*2 | 10.16X10.16 mm X0.73 mm *2 | 10.16X10.16 mm X0.73 mm *2 | 8.89X8.89 mm X0.88 mm *2 | 8.89X8.89 mm X0.88 mm *2 | | |
| STACKED CHIP | N/A | N/A | N/A | 8.26X4.45 mmX0.55mm 8.26X8.26 mmX0.55mm | 8.26X4.45 mmX0.55mm 8.26X8.26 mmX0.55mm | | |

FIG.10

| KIND | 1 | 2 | 3 | 4 | 5 | 6 | 7 |
|---|---|---|---|---|---|---|---|
| DEGREE OF WARPAGE DEFECTS (m) | 4.14e-4 | 4.19e-4 | 4.23e-4 | 4.26e-4 | 4.11e-4 | 4.07e-4 | 4.51e-4 |
| MAIN PRINCIPAL STRESS (Mpa) | 78.2 | 78.2 | 78.2 | 78.8 | 78.2 | 78.3 | 77.9 |
| KIND | 8 | 9 | 10 | 11 | 12 | 13 | 14 |
| DEGREE OF WARPAGE DEFECTS (m) | 3.93e-4 | 3.72e-4 | 4.1e-4 | 4.05e-4 | 3.88e-4 | 3.62e-4 | 4.08e-4 |
| MAIN PRINCIPAL STRESS (Mpa) | 78.2 | 78.3 | 78.2 | 78.3 | 78.3 | 78.5 | 78.2 |
| KIND | 15 | 16 | 17 | 18 | 19 | | |
| DEGREE OF WARPAGE DEFECTS (m) | 4.01e-4 | 3.76e-4 | 3.4e-4 | 3.27e-4 | 2.95e-4 | | |
| MAIN PRINCIPAL STRESS (Mpa) | 78.3 | 78.3 | 78.5 | 98.8 | 94.4 | | |

DEGREE OF WARPAGE DEFECTS (m)

FIG.16

MAIN PRINCIPAL STRESS (MPa)

ID_CIRCUIT PACKAGE WITH A
BALANCED-PART STRUCTURE

INTEGRATED CIRCUIT PACKAGE WITH A BALANCED-PART STRUCTURE

BACKGROUND OF THE INVENTION

1. Field of the Invention

The present invention relates to an integrated circuit package, and more particularly, to an integrated circuit package with a balanced-part structure.

2. Description of the Prior Art

The integrated circuit formed on a semiconductor structure to form an integrated circuit chip is used to be set in a package, i.e. the Quad Flat Package, QFP. The flat package includes leads connected with a lead frame for contacted with the integrated circuit chip. The chip is packaged inside an electric-isolating stable plastic including mechanical support. The leads are soldered on a Printed Circuit Board, PCB.

Many integrated circuit packaging technologies are very important and are improved for packaging the smaller integrated circuit element including million transistor circuits, i.e. the circuits and the dies. The integrated circuit is formed on a silicon wafer through many processes, i.e. the etching process, the implanting process, the depositing process and the cutting process. A silicon wafer includes integrated circuit chips, i.e. dies, wherein each die is an independent integrated circuit. After the silicon wafer is cut to be many chips, each chip must be packaged to form an integrated circuit package with leads. Chips could be packaged to be different types according to the layout of the integrated circuit packages, i.e. M Dual-In-Line-Package, M-Dip. The leads of the M-Dip extend from the bottom of the M-Dip to contact with and fasten on the PCB in two parallel rows. A PCB including more integrated circuit may be a Single-In-Line-Package, SIP, or a Small Outline J-leaded, SOJ.

According to the amount of chips, the Single Chip Package, SCP, method and the Multi-chip Package, MCP, method are the main packaging types of the integrated circuit packaging technologies, wherein the MCP method includes the Multi-chip Module, MCM, method. According to the contacting styles between leads and a PCB, the integrated circuit packages include the Pin-Through-Hole, PTH, packages and the Surface Mount Technology, SMT, packages. Leads of a PTH package are acicular leads or sheet leads to pin through the sockets or the holes on the PCB for fastening and soldering. A SMT package is fastened on a PCB by soldering. An advanced and improved packaging method is the Direct Chip Attach, DCA, packaging method. The DCA packaging method directly attaches and fastens chips on a substrate, and then connects the chips and the substrate for electrical connection to shrink the size of the whole integrated circuit package.

The problems about mechanical stress and thermal mechanical stress of the integrated circuit packages become obviously as more as the integrated circuit packages are smaller. A little integrated circuit package may get warpage defects of a substrate of the integrated circuit package due to the non-uniform mechanical stress and the non-uniform thermal stress on the substrate while the chips operating. A single chip is fastened on the center of a substrate of an integrated circuit package to balance mechanical stress due to the weight of the chip and the substrate if there is only one chip packaged inside the integrated circuit package. Warpage defect of the substrate and the integrated circuit package does not appear if the stress, i.e. mechanical stress and thermal stress, of the substrate and the whole integrated circuit package balances very well. So that warpage defect of the integrated circuit package with only one chip is usually very small or disappeared because thermal stress inside the integrated circuit package balances very well.

In order to operate an integrated circuit package more effectively and shrink the scale of the integrated circuit package, a plurality of chips are fastened on a substrate of the integrated circuit package for receiving, transmitting and processing a plurality of signals simultaneously by only one integrated circuit package. Of course the chips fastened inside the integrated circuit package may include different material, different size, different weight, etc. according to the functions of the integrated circuit package. The chips with different material, different size, different weight, etc. break the balance of the stress, i.e. mechanical stress and thermal stress of the substrate and the integrated circuit package. Hence warpage defects of the substrate and the integrated circuit package would appear because of thermal stress caused from operating chips. Warpage defects affect the operation of the integrated circuit package and spall or crack the chips fastened on the substrate. Thus, the quality of the integrated circuit package becomes worse because of the unbalanced stress inside the integrated circuit package.

According to the above description, it's necessary to develop an integrated circuit package to prevent warpage defects due to the unbalanced mechanical stress and the unbalanced thermal stress of operating chips to maintain the quality of the integrated circuit package.

SUMMARY OF THE INVENTION

According to the above description of the background of the invention, the present invention provides an integrated circuit package with a balanced-part structure to reduce the degree of warpage of the integrated circuit package.

The present invention provides an integrated circuit package with a balanced-part structure to balance the stress of the substrate to increase the yield and the stability of the integrated circuit package, even if the scale of the integrated circuit package becomes smaller.

The present invention provides an integrated circuit package with a balanced-part structure to balance the stress and prevent the integrated circuit package from warpage defects. The amount, the positions, the weights, and condition of thermal stress of the chips are decided to fasten a plurality of balanced-parts on the substrate before a heat sink and a packaging molding compound being fastened on the chips to balance stress distribution on the substrate. These balanced-parts can also reduce the affect of thermal stress and further avoid warpage defects in the integrated circuit packages.

DESCRIPTION OF THE PREFERRED EMBODIMENT

In the present disclosure, the words "a" or "an" are to be taken to include both the singular and the plural. Conversely, any reference to plural items shall, where appropriate, include the singular.

The preferred embodiment of the present invention provides an integrated circuit package with a balanced-part structure to prevent the integrated circuit package from warpage defects by setting a plurality of the balanced-parts on the substrate of the integrated circuit package. Nonetheless, it should be recognized that the present invention can be practiced in a wide range of other embodiments besides those explicitly described, and the scope of the present invention is expressly not limited except as specified in the accompanying claims.

Figure 1:
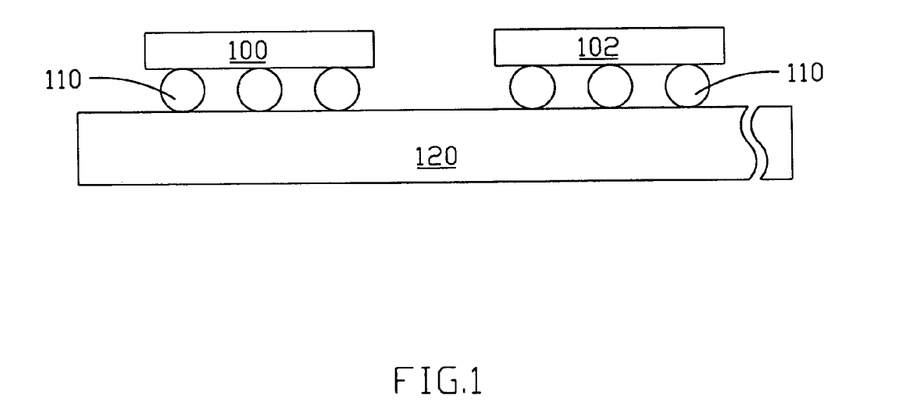
FIG. 1 is a schematic drawing of a non-packaged integrated circuit package.
Figure 2:
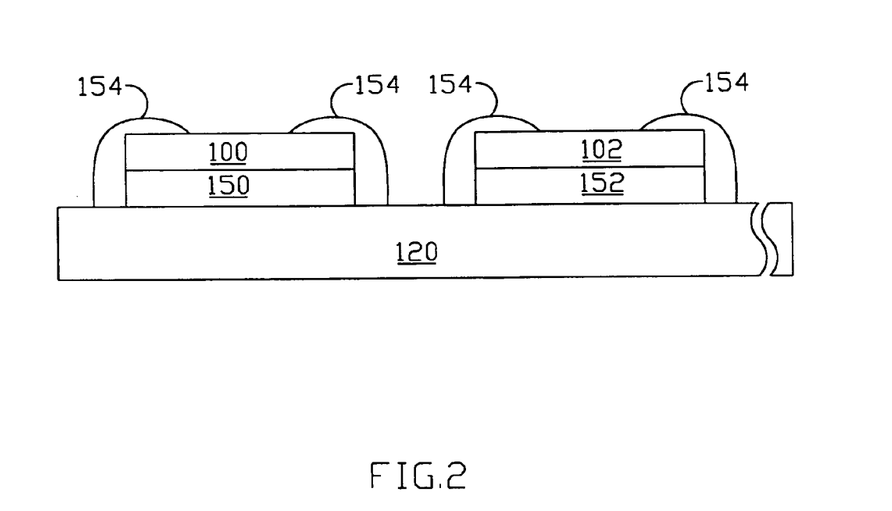
FIG. 2 is a schematic drawing of another kind of a non-packaged integrated circuit package.
Figure 3:
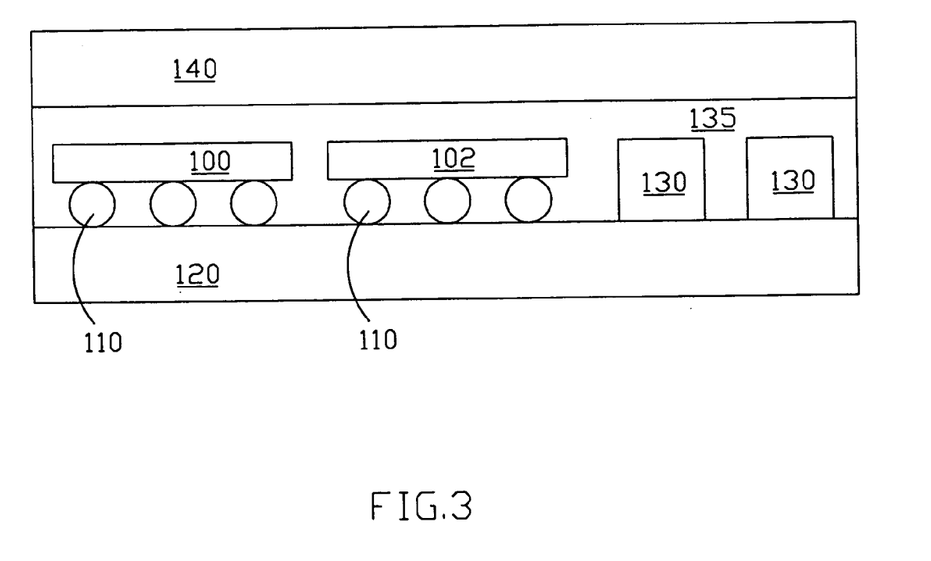
FIG. 3 is a schematic drawing of an integrated circuit package.
Figure 4:
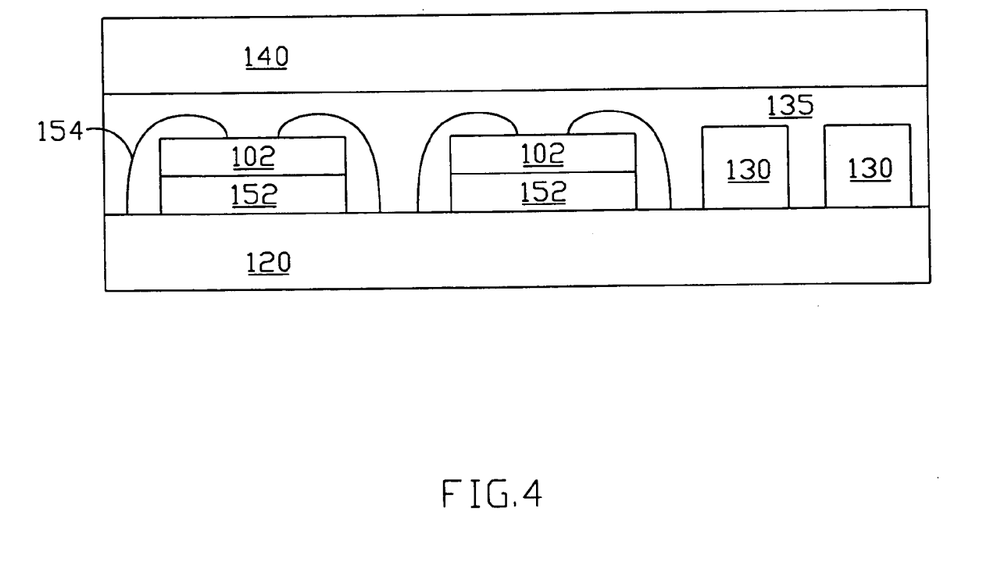
FIG. 4 is a schematic drawing of another kind of an integrated circuit package.

As shown in FIG. 1, two chips 100 and 102 are fastened on and connect with a substrate 120 by a plurality of welding parts 110. As shown in FIG. 2, chips 100 and 102 could be fastened on a substrate 120 by bonding layers 150 and 152, respectively, and connect with the substrate 120 by a plurality of wires 154. As shown in FIG. 3 and FIG. 4, balanced-parts 130 are fastened on pre-designed positions of the substrate 120 of each integrated circuit package in a chip-packaging process. The pre-designed positions are decided according to the amount, the weight, relative position of chips, i.e. chips 100 and 102, and thermal stress caused by the chips 100 and 102 during operation.

A packaging molding compound 135 is formed on the substrate 120, chips 100 and 102 and the balanced-parts 130 to protect chips 100 and 102. If it is necessary, a heat sink 140 is fastened on the packaging molding compound 135 to increase the cooling efficiency for cooling the whole integrated circuit package. The balanced-parts 130 are fastened on the substrate 120 to prevent the integrated circuit package from warpage defects caused by the unbalance mechanical stress and thermal stress due to heat of operating chips 100 and 102. The amount, the material, the weight of the balanced-parts 130 and the positions where the balanced-parts 130 are fastened are decided upon the amount and the weight of chips 100 and 102, the positions where the chips 100 and 102 are fastened and condition of thermal stress.

Figure 5:
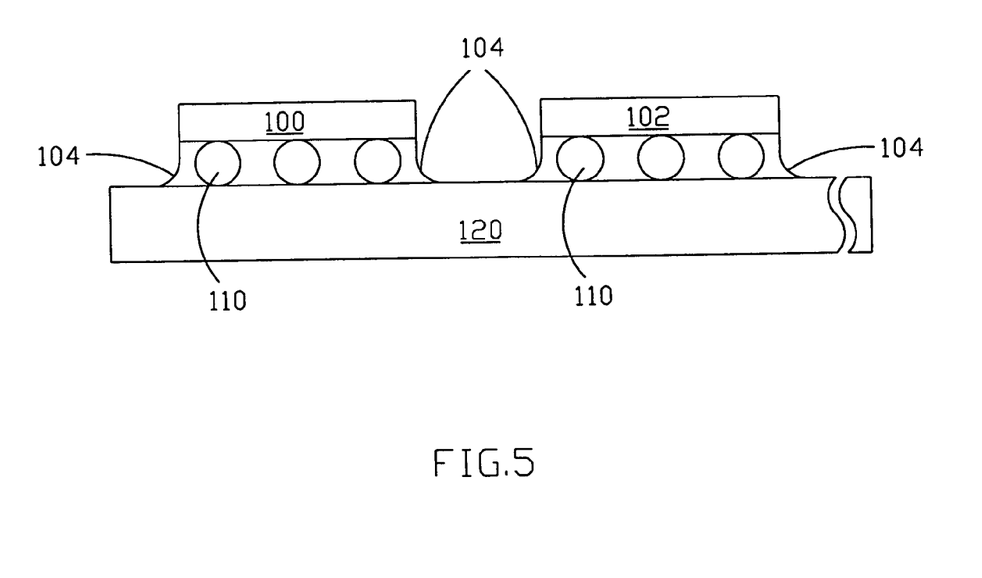
FIG. 5 is a schematic drawing of an integrated circuit package fabricated by a flip-chip underfill process.
Figure 6:
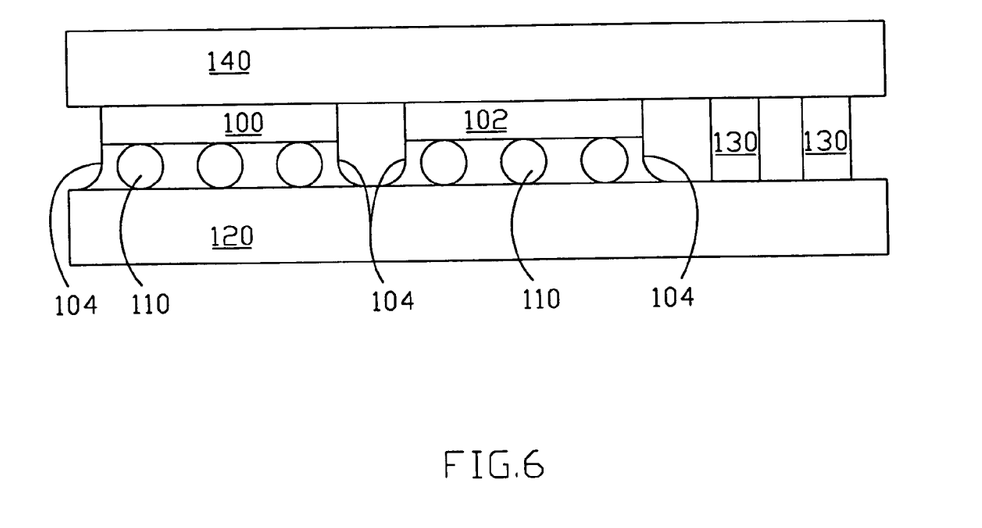
FIG. 6 is a schematic drawing of an integrated circuit package packaged with a plurality of balanced-parts.

As shown in FIG. 5, chips 100 and 102 contacts with welding parts 110 to be fastened on a substrate 120 by underfill materials 104 in a flip-chip underfill process. As shown in FIG. 6, balanced-parts 130 are fastened on pre-designed positions of the substrate 120 to reduce the effect due to thermal stress caused by the operation of chips 100 and 102. If it is necessary, a heat sink 140 is fastened on the chips 100 and 102 and balanced-parts 130 to increase the cooling efficiency for cooling the whole integrated circuit package. The balanced-parts 130 are fastened on the substrate 120 to prevent the integrated circuit package from warpage defects caused by the unbalance mechanical stress and thermal stress due to heat of operating chips 100 and 102. The amount, the material, the weight of the balanced-parts 130 and the positions where the balanced-parts 130 are fastened are decided upon the amount and the weight of chips 100 and 102, the positions where the chips 100 and 102 are fastened and condition of thermal stress.

Figure 7:
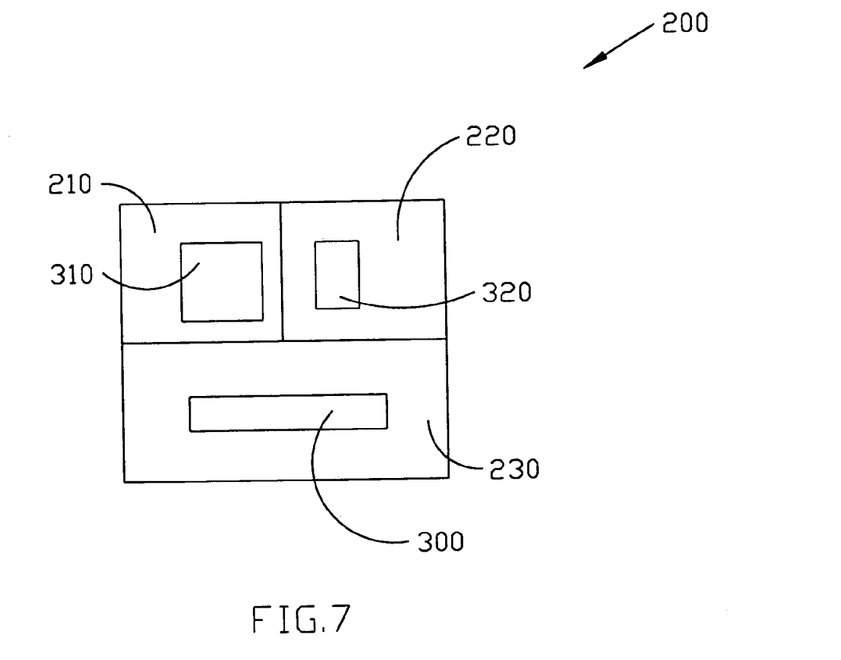
FIG. 7 is a top view of an integrated circuit package with a balanced-part.

As shown in FIG. 7, it shows a top view of a substrate. A substrate 200 is divided into a first portion 210, a second portion 220 and a third portion 230. A first chip 310 is fastened in the first portion 210. A second chip 320 is fastened in the second portion 220. A balanced-part 300 is fastened in the third portion 230. The first chip 310 and the second chip 320 may be a single chip or a stacked die to process the signals inside the integrated circuit package. The width of the third portion 230 equals to the width consisted of the first portion 210 and the second portion 220. The balanced-part 300 is thicker than the first chip 310 and the second chip 320. The balanced-part 300 balances the stress caused from the weight of the first chip 310 and the second chip 320 on the substrate 200. The balanced-part 300 also balances thermal stress caused by operating chips 310 and 320 to prevent the integrated circuit package from warpage defects and the over-concentration of stress.

The data shown in the following preferred embodiment is the result of a simulated experiment of the present invention to prove the balanced-part structure can prevent the integrated circuit package from warpage defects. Certainly, the followed preferred embodiment does not limit the scope of the present invention to what described detailed herein.

Figure 8:
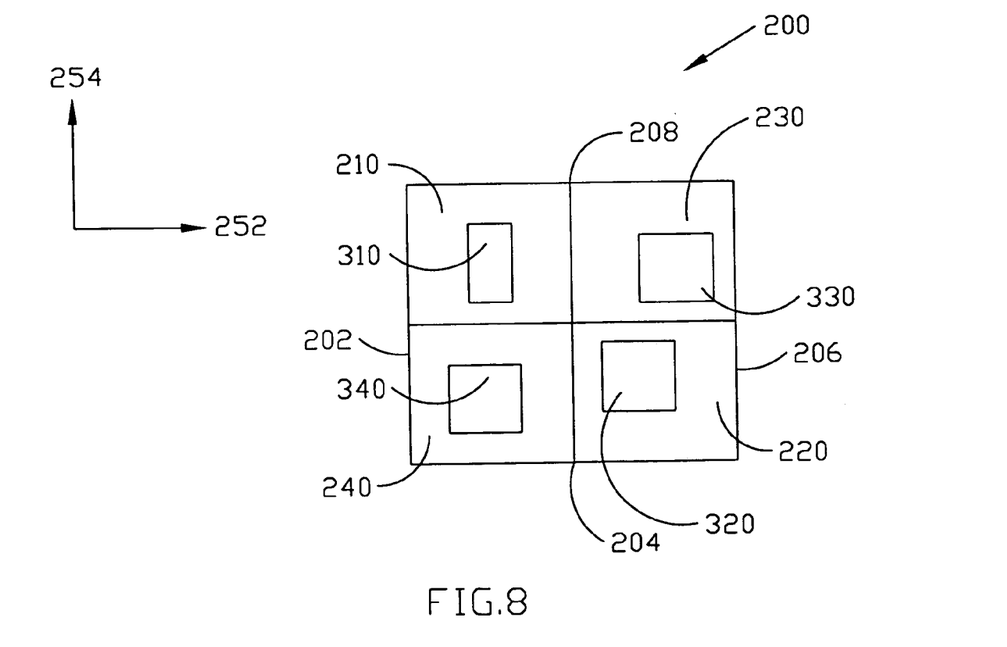
FIG. 8 is a top view of an integrated circuit package with two balanced-parts.

As shown in FIG. 8, a substrate 200 is divided into a first portion 210, a second portion 220, a third portion 230 and a fourth portion 240. A first chip 310 is fastened in the first portion 210. A second chip 320 is fastened in the second portion 220. A first balanced-part 330 is fastened in the third portion 230. A second balanced-part 340 is fastened in the fourth portion 240. The first chip 310 and the second chip 320 may be a single die or a stacked die according to the design of the integrated circuit package to process the signal of the integrated circuit package.

Figure 9:
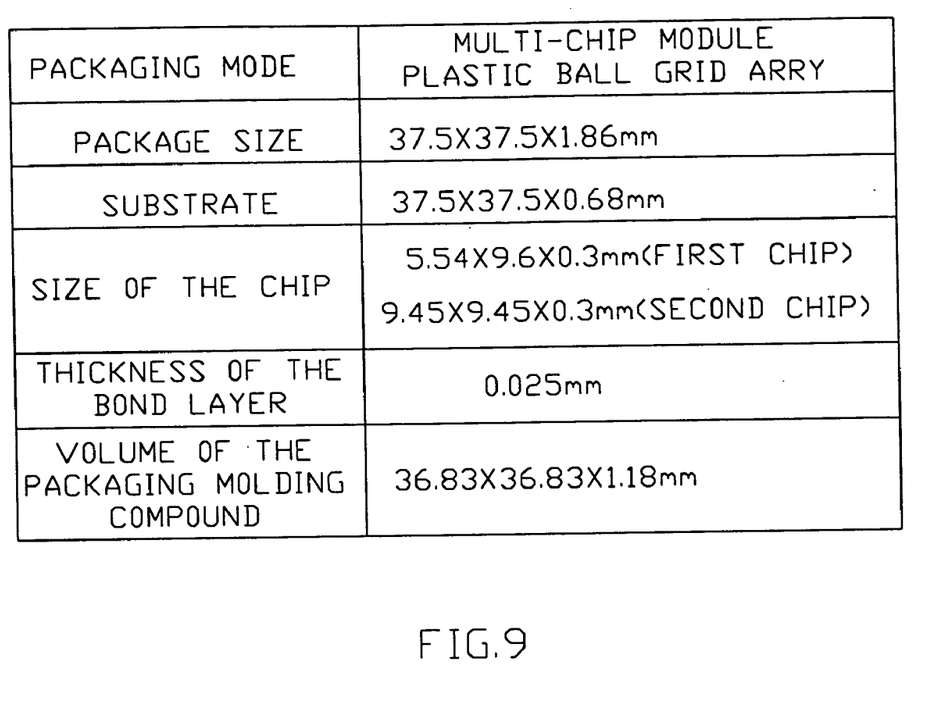
FIG. 9 is a data list of the elements of an integrated circuit package according to the present invention.

As shown in FIG. 9, the present integrated circuit package is packaged by Multi-Chip Module Plastic Ball Grid Array, MCM PBGA. Package size of the present integrated circuit package is about 37.5 millimeters×37.5 millimeters ×1.86 millimeter, wherein the width along the axis 252 equals to the length along the axis 254. The size of the substrate of the integrated circuit package is about 37.5 millimeters×37.5 millimeters×0.68 millimeter, wherein the width along the axis 252 equals to the length along the axis 254. The substrate is a four-tiers structure. The width along the axis 252 of the first chip 310 is about 5.54 millimeters, the length along the axis 254 of the first chip 310 is about 9.6 millimeters and the thickness of the first chip 310 is about 0.3 millimeter. The width along the axis 252 of the second chip 320 is about 9.45 millimeters, the length along the axis 254 of the second chip 320 is about 9.45 millimeters and the thickness of the second chip 320 is about 0.3 millimeter. The thickness of a bonding layer for fastening chips 310 and 320 on the substrate 200 is approximately 0.025 millimeter. The width along the axis 252 of the packaging molding compound is about 36.83 millimeters, the length along the axis 254 of the packaging molding compound is about 36.83 millimeters and the thickness of the packaging molding compound is about 1.18 millimeter. The axis 252 and the axis 254 are perpendicular to one other.

Figure 10:
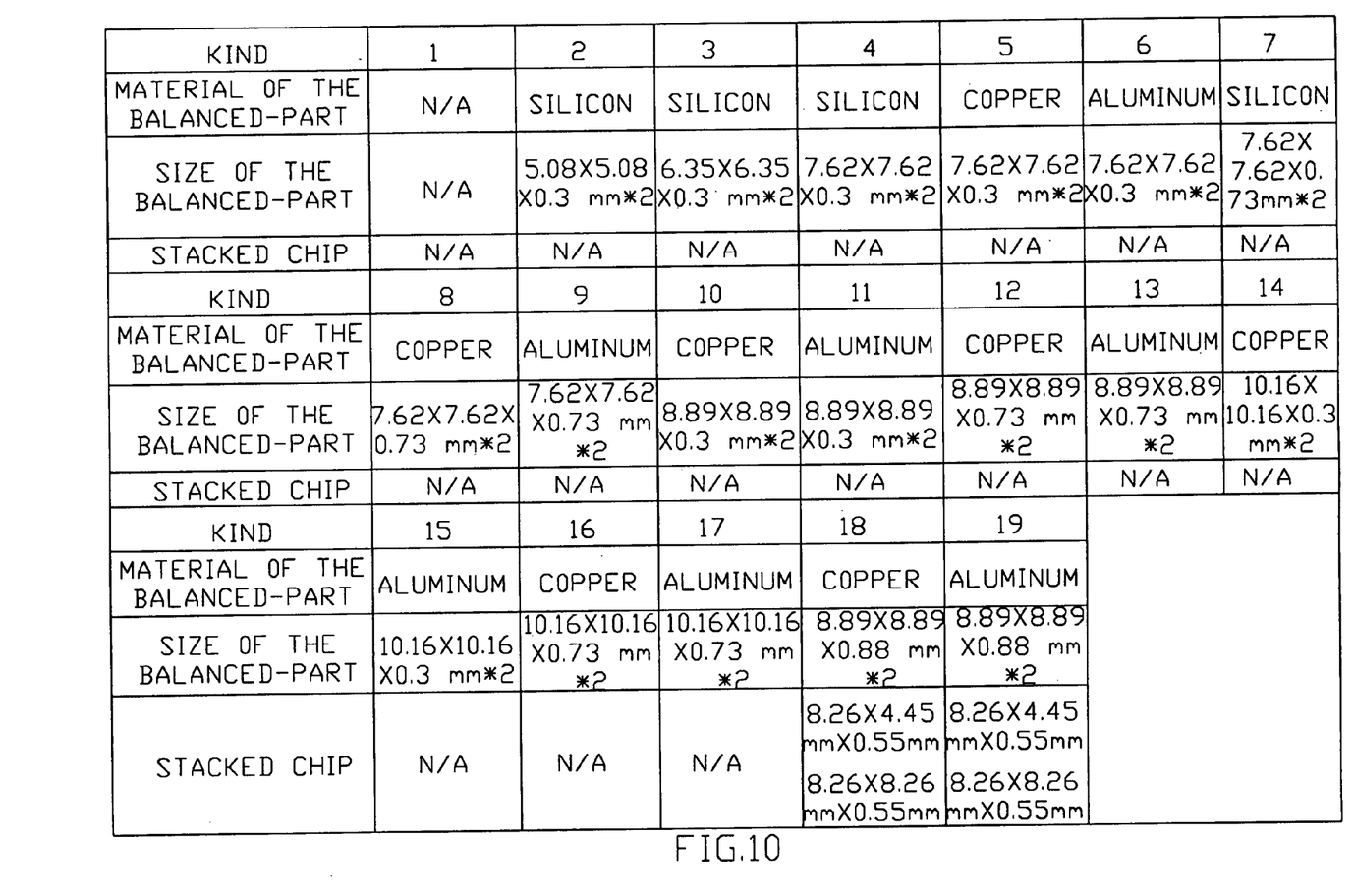
FIG. 10 is a data list of the elements of various kinds of integrated circuit packages.

As shown in FIG. 10, the first kind of the prior integrated circuit package is not fastened any balanced-part inside the integrated circuit package, wherein the chip of the first kind of the integrated circuit package is a common silicon chip. The material of the balanced-parts of the second kind of the integrated circuit package is silicon. Thus the balanced-parts of the second kind of the integrated circuit package may be the single-crystal silicon wafers. The width along the axis 252 of each balanced-part of the second kind of the integrated circuit package is about 5.08 millimeters, the length along the axis 254 of the balanced-part is about 5.08 millimeters and the thickness of the balanced-part is about 0.3 millimeter. The chips 310 and 320 of the second kind of the integrated circuit package are common chips. The balanced-parts of the third kind of the integrated circuit package are single-crystal silicon wafers. The width along the axis 252 of each balanced-part of the third kind of the integrated circuit package is about 6.35 millimeters, the length along the axis 254 of the balanced-part is about 6.35 millimeters and the thickness of the balanced-part is about 0.3 millimeter. The chips 310 and 320 of the third kind of the integrated circuit package are common chips. The balanced-parts of the fourth kind of the integrated circuit package are single-crystal silicon wafers. The width along the axis 252 of each balanced-part of the fourth kind of the integrated circuit package is about 7.62 millimeters, the length along the axis 254 of the balanced-part is about 7.62 millimeters and the thickness of the balanced-part is about 0.3 millimeter. The chips 310 and 320 of the fourth kind of the integrated circuit package are common chips. The material of the balanced-parts of the fifth kind of the integrated circuit package is copper. The width along the axis 252 of each balanced-part of the fifth kind of the integrated circuit package is about 7.62 millimeters, the length along the axis 254 of the balanced-part is about 7.62 millimeters and the thickness of the balanced-part is about 0.3 millimeter. The chips 310 and 320 of the fifth kind of the integrated circuit package are common chips. The material of the balanced-parts of the sixth kind of the integrated circuit package is aluminum. The width along the axis 252 of each balanced-part of the sixth kind of the integrated circuit package is about 7.62 millimeters, the length along the axis 254 of the balanced-part is about 7.62 millimeters and the thickness of the balanced-part is about 0.3 millimeter. The chips 310 and 320 of the sixth kind of the integrated circuit package are common chips. The balanced-parts of the seventh kind of the integrated circuit package are single-crystal silicon wafers. The width along the axis 252 of each balanced-part of the seventh kind of the integrated circuit package is about 7.62 millimeters, the length along the axis 254 of the balanced-part is about 7.62 millimeters and the thickness of the balanced-part is about 0.73 millimeter. The chips 310 and 320 of the seventh kind of the integrated circuit package are common chips. The material of the balanced-parts of the eighth kind of the integrated circuit package is copper. The width along the axis 252 of each balanced-part of the eighth kind of the integrated circuit package is about 7.62 millimeters, the length along the axis 254 of the balanced-part is about 7.62 millimeters and the thickness of the balanced-part is about 0.73 millimeter. The chips 310 and 320 of the eighth kind of the integrated circuit package are common chips. The material of the balanced-parts of the ninth kind of the integrated circuit package is aluminum. The width along the axis 252 of each balanced-part of the ninth kind of the integrated circuit package is about 7.62 millimeters, the length along the axis 254 of the balanced-part is about 7.62 millimeters and the thickness of the balanced-part is about 0.73 millimeter. The chips 310 and 320 of the ninth kind of the integrated circuit package are common chips. The material of the balanced-parts of the tenth kind of the integrated circuit package is copper. The width along the axis 252 of each balanced-part of the tenth kind of the integrated circuit package is about 8.89 millimeters, the length along the axis 254 of the balanced-part is about 8.89 millimeters and the thickness of the balanced-part is about 0.3 millimeter. The chips 310 and 320 of the tenth kind of the integrated circuit package are common chips. The material of the balanced-parts of the eleventh kind of the integrated circuit package is aluminum. The width along the axis 252 of each balanced-part of the eleventh kind of the integrated circuit package is about 8.89 millimeters, the length along the axis 254 of the balanced-part is about 8.89 millimeters and the thickness of the balanced-part is about 0.3 millimeter. The chips 310 and 320 of the eleventh kind of the integrated circuit package are common chips. The material of the balanced-parts of the twelfth kind of the integrated circuit package is copper. The width along the axis 252 of each balanced-part of the twelfth kind of the integrated circuit package is about 8.89 millimeters, the length along the axis 254 of the balanced-part is about 8.89 millimeters and the thickness of the balanced-part is about 0.73 millimeter. The chips 310 and 320 of the twelfth kind of the integrated circuit package are common chips. The material of the balanced-parts of the thirteenth kind of the integrated circuit package is aluminum. The width along the axis 252 of each balanced-part of the thirteenth kind of the integrated circuit package is about 8.89 millimeters, the length along the axis 254 of the balanced-part is about 8.89 millimeters and the thickness of the balanced-part is about 0.3 millimeter. The chips 310 and 320 of the thirteenth kind of the integrated circuit package are common chips. The material of the balanced-parts of the fourteenth kind of the integrated circuit package is copper. The width along the axis 252 of each balanced-part of the fourteenth kind of the integrated circuit package is about 10.16 millimeters, the length along the axis 254 of the balanced-part is about 10.16 millimeters and the thickness of the balanced-part is about 0.3 millimeter. The chips 310 and 320 of the fourteenth kind of the integrated circuit package are common chips. The material of the balanced-parts of the fifteenth kind of the integrated circuit package is aluminum. The width along the axis 252 of each balanced-part of the eleventh kind of the integrated circuit package is about 10.16 millimeters, the length along the axis 254 of the balanced-part is about 10.16 millimeters and the thickness of the balanced-part is about 0.3 millimeter. The chips 310 and 320 of the fifteenth kind of the integrated circuit package are common chips. The material of the balanced-parts of the sixteenth kind of the integrated circuit package is copper. The width along the axis 252 of each balanced-part of the sixteenth kind of the integrated circuit package is about 10.16 millimeters, the length along the axis 254 of the balanced-part is about 10.16 millimeters and the thickness of the balanced-part is about 0.73 millimeter. The chips 310 and 320 of the sixteenth kind of the integrated circuit package are common chips. The material of the balanced-parts of the seventeenth kind of the integrated circuit package is aluminum. The width along the axis 252 of each balanced-part of the seventeenth kind of the integrated circuit package is about 10.16 millimeters, the length along the axis 254 of the balanced-part is about 10.16 millimeters and the thickness of the balanced-part is about 0.73 millimeter. The chips 310 and 320 of the seventeenth kind of the integrated circuit package are common chips. The material of the balanced-parts of the eighteenth kind of the integrated circuit package is copper. The width along the axis 252 of each balanced-part of the eighteenth kind of the integrated circuit package is about 8.89 millimeters, the length along the axis 254 of the balanced-part is about 8.89 millimeters and the thickness of the balanced-part is about 0.88 millimeter. The chips 310 and 320 of the eighteenth kind of the integrated circuit package are stacked dies. The material of the balanced-parts of the nineteenth kind of the integrated circuit package is aluminum. The width along the axis 252 of each balanced-part of the nineteenth kind of the integrated circuit package is about 8.89 millimeters, the length along the axis 254 of the balanced-part is about 8.89 millimeters and the thickness of the balanced-part is about 0.88 millimeter. The chips 310 and 320 of the nineteenth kind of the integrated circuit package are stacked dies.

Figure 11:
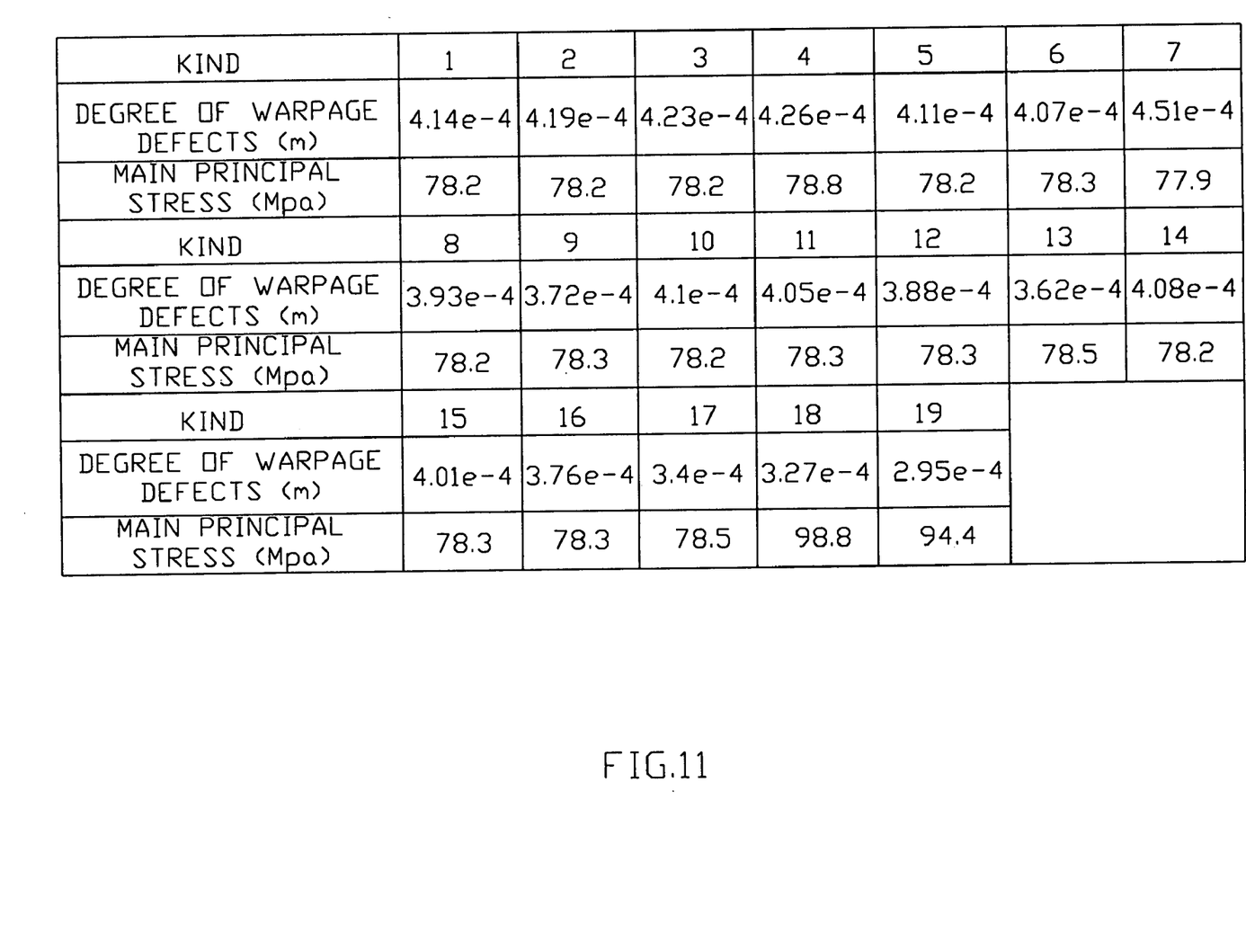
FIG. 11 is a data list of the degree of warpage and the main principal stress of various kinds of integrated circuit packages.
Figure 12:
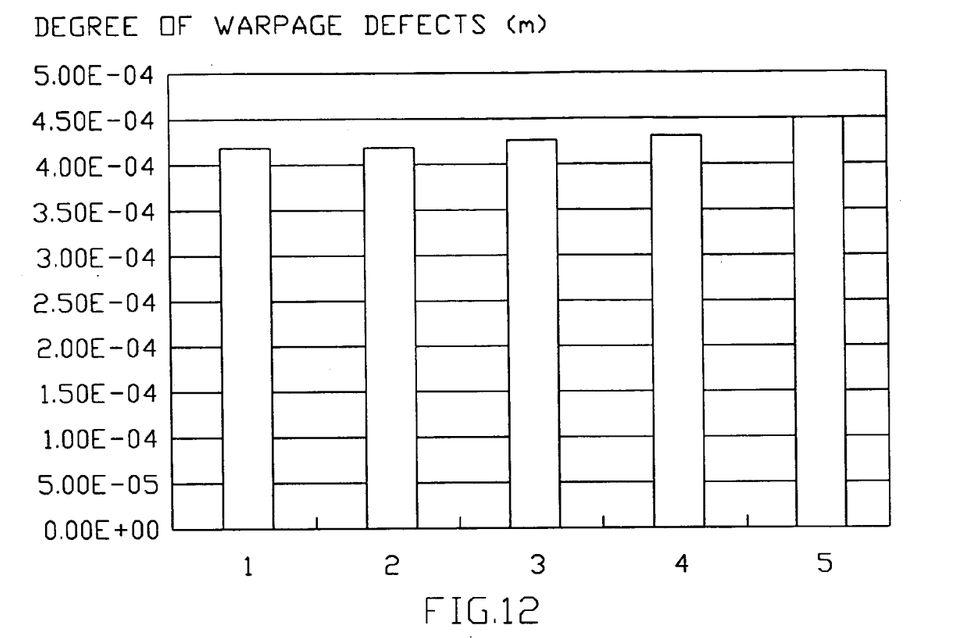
FIG. 12 is a data chart of the degree of warpage of various kinds of integrated circuit packages.
Figure 13:
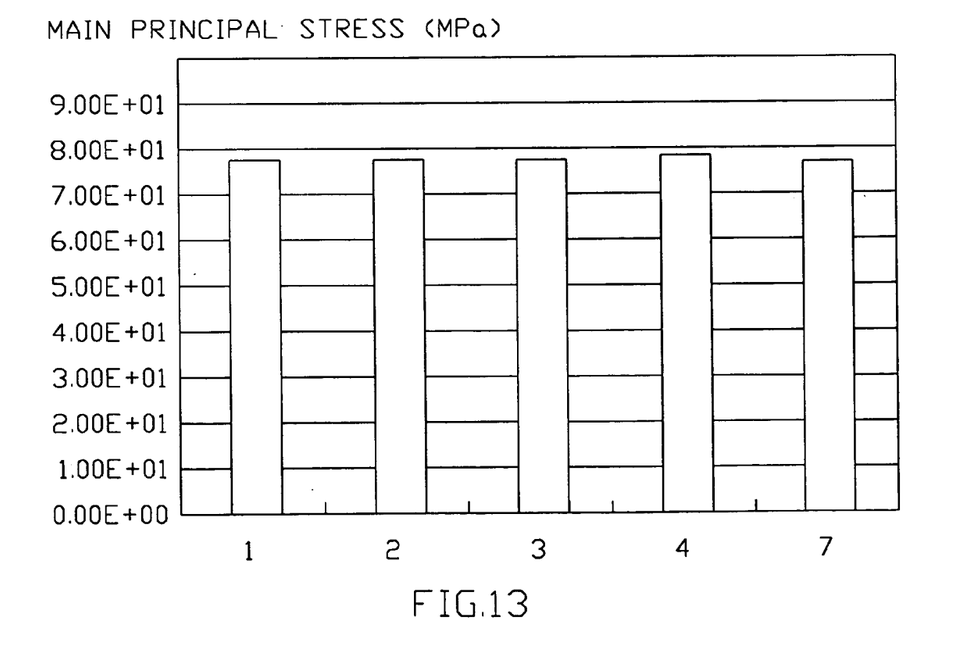
FIG. 13 is a data chart of the main principal stress of various kinds of integrated circuit packages.

As shown in FIG. 11, different material and different size of the balanced-parts and different type of chips causes different degree of warpage, millimeter, and different main principal stress, MPa. The degree of warpage of the first kind, the second kind, the third kind and the seventh kind of the integrated circuit package is illustrated with FIG. 12. The main principal stress of the first kind, the second kind, the third kind and the seventh kind of the integrated circuit package is illustrated with FIG. 13. The material of the balanced-parts of each kind of the integrated circuit package that is compared in FIG. 12 and FIG. 13 is the same, i.e. the single-crystal silicon. The size of the balanced-parts of each kind of the integrated circuit package is different. As shown in FIG. 12, the degree of warpage of each kind of the integrated circuit package increases when the size of the balanced-parts increases. Thus warpage defects of the integrated circuit package becomes worse if the material of the balanced-parts is single-crystal silicon. As shown in FIG. 13, the main principal stress maintains almost the same when the size of each balanced-part of various kinds of the integrated circuit packages is different.

Figure 14:
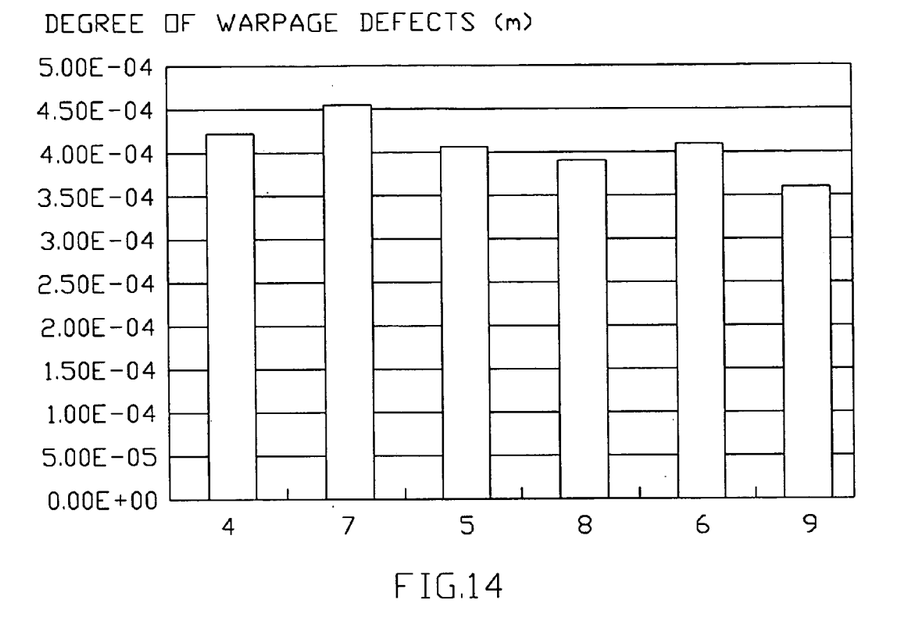
FIG. 14 is a data chart of the degree of warpage of various kinds of integrated circuit packages.
Figure 15:
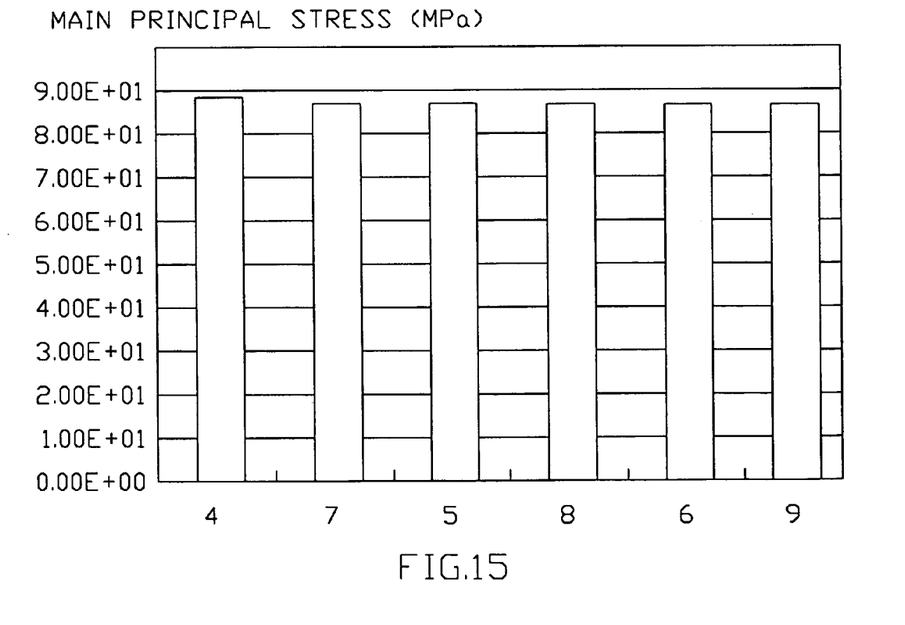
FIG. 15 is a data chart of the main principal stress of various kinds of integrated circuit packages.

The degree of warpage of the fourth kind, the seventh kind, the fifth kind, the eighth kind, the sixth kind and the ninth kind of the integrated circuit package is illustrated with FIG. 14. The main principal stress of the fourth kind, the seventh kind, the fifth kind, the eighth kind, the sixth kind and the ninth kind of the integrated circuit package is illustrated with FIG. 15. The material and the size of the balanced-parts of various kinds of the integrated circuit package illustrated with FIG. 14 and FIG. 15 is different. The degree of warpage of the eighth kind and the ninth kind of the integrated circuit package is smaller than that of the others illustrated with FIG. 14. The degree of warpage of the seventh kind of the integrated circuit package is the largest of various kinds of the integrated circuit package illustrated with FIG. 14. The result illustrated with FIG. 14 means that the balanced-parts made of aluminum or copper could reduce the degree of warpage of the integrated circuit package with the chips made of common chips. As shown in FIG. 15, the different size and the different material of the balanced-parts of various kinds of the integrated circuit packages does not obviously affect the main principal stress of each integrated circuit package.

Figure 16:
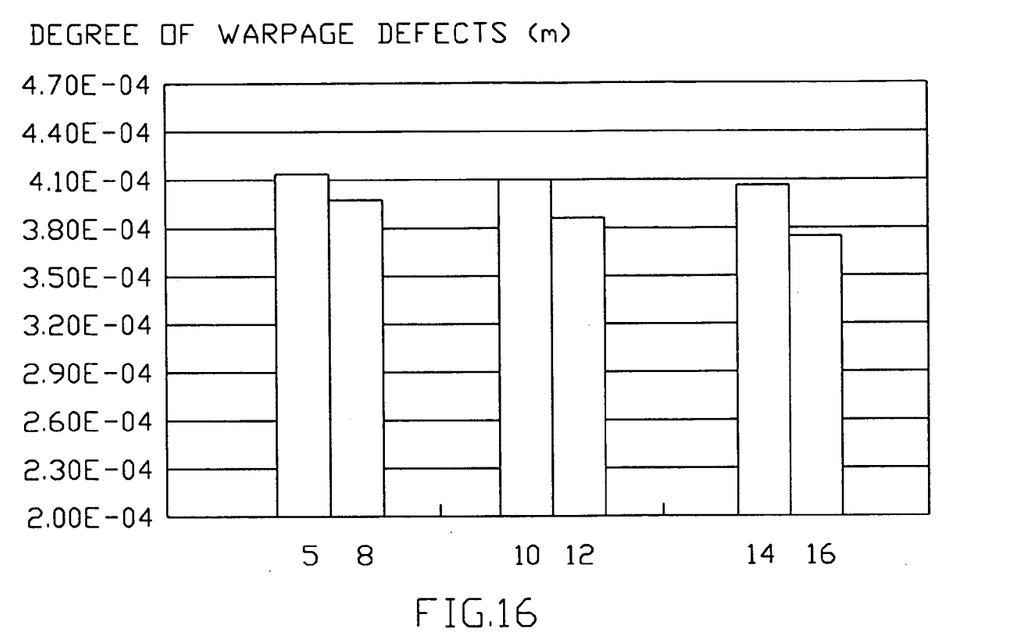
FIG. 16 is a data chart of the degree of warpage of various kinds of integrated circuit packages.
Figure 17:
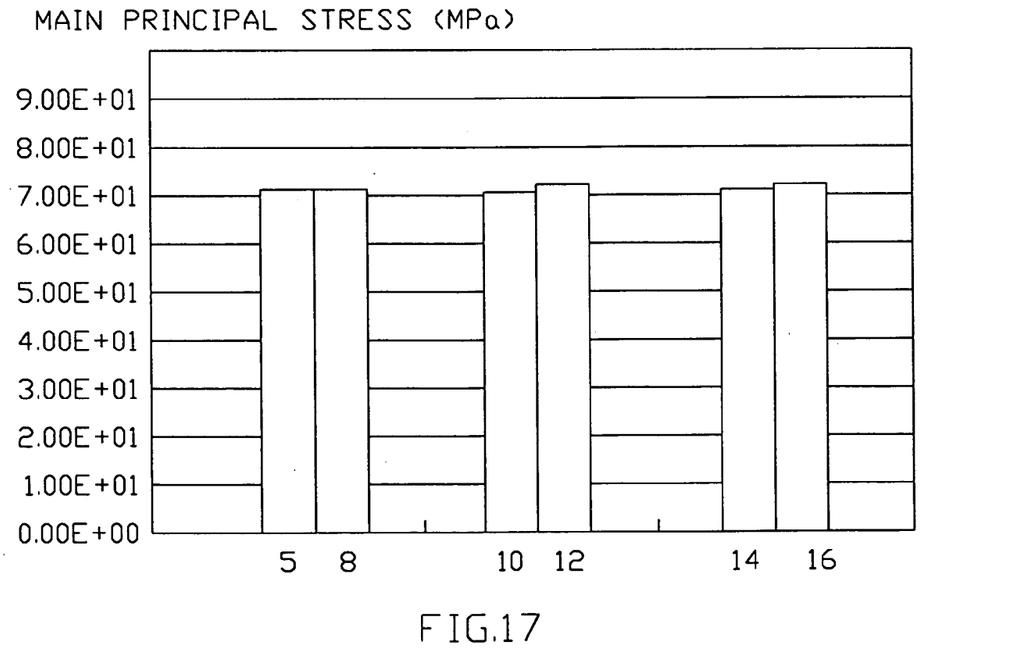
FIG. 17 is a data chart of the main principal stress of various kinds of integrated circuit packages.

The comparison of the degree of warpage between the fifth kind with the eighth kind, the tenth kind with the twelfth kind and the fourteenth kind with the sixteenth kind of the integrated circuit package is illustrated with FIG. 16. The comparison of the main principal stress between the fifth kind with the eighth kind, the tenth kind with the twelfth kind and the fourteenth kind with the sixteenth kind of the integrated circuit package is illustrated with FIG. 17. The thickness of the balanced-parts of the fifth kind and the eighth kind, the thickness of the balanced-parts of the tenth kind and the twelfth kind, and the thickness of the fourteenth kind and the sixteenth kind of the integrated circuit package are different. The thickness of the balanced-parts of the fifth kind, the tenth kind and the fourteenth kind of the integrated circuit package is approximately 0.3 millimeter. The thickness of the balanced-parts of the eighth kind, the twelfth kind and the sixth kind of the integrated circuit package is approximately 0.73 millimeter. If the chips of the integrated circuit package are made of common chips and the material of the balanced-parts of each kind of the integrated circuit package is the same, the balanced-parts with larger size reduce the degree of warpage of the integrated circuit package more. The balanced-parts made of aluminum reduce the degree of warpage of the integrated circuit package more than the balanced-parts made of copper. As shown in FIG. 17, different thickness of the balanced-parts of various kinds of the integrated circuit packages does not obviously affect the main principal stress of each integrated circuit package.

Figure 18:
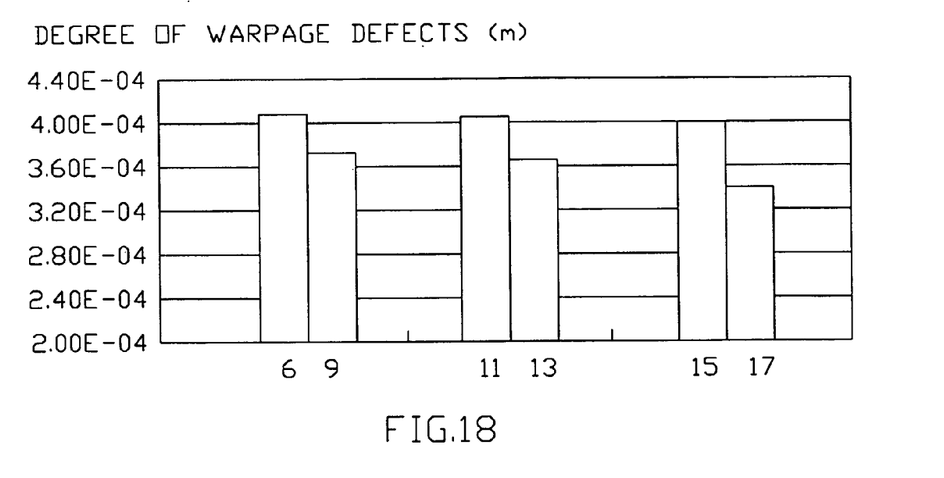
FIG. 18 is a data chart of the degree of warpage of various kinds of integrated circuit packages.
Figure 19:
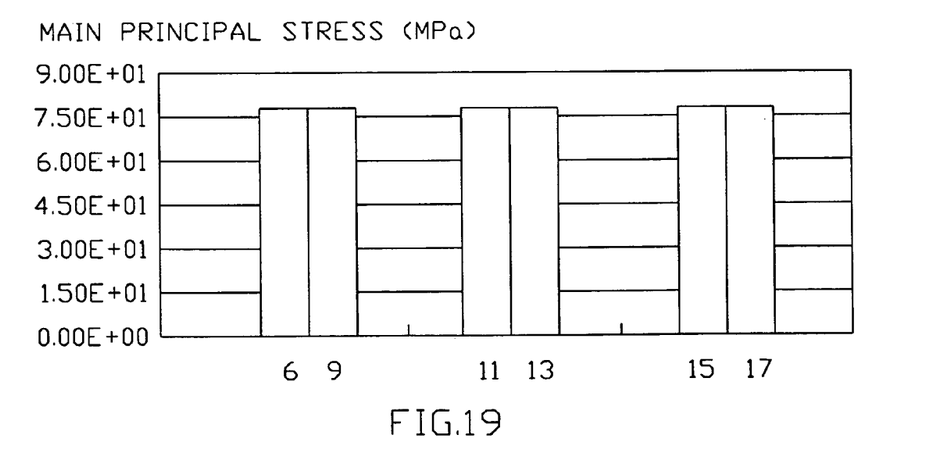
FIG. 19 is a data chart of the main principal stress of various kinds of integrated circuit packages.

The comparison of the degree of warpage between the sixth kind with the ninth kind, the eleventh kind with the thirteenth kind and the fifteenth kind with the seventeenth kind of the integrated circuit package is illustrated with FIG. 18. The comparison of the main principal stress between the sixth kind with the ninth kind, the eleventh kind with the thirteenth kind and the fifteenth kind with the seventeenth kind of the integrated circuit package is illustrated with FIG. 19. The material of the balanced-parts of various kinds of the integrated circuit package is aluminum. The chips of various kinds of the integrated circuit package are common chips. The thicker balanced-parts reduce the degree of warpage of the integrated circuit package more. As shown in FIG. 19, different thickness of the balanced-parts of various kinds of the integrated circuit packages does not obviously affect the main principal stress of each integrated circuit package.

Figure 20:
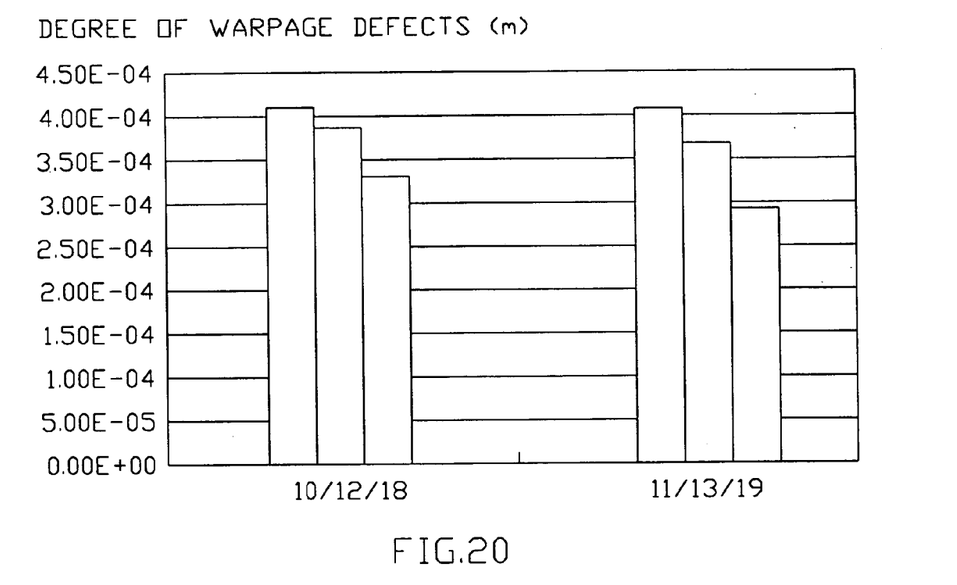
FIG. 20 is a data chart of the degree of warpage of various kinds of integrated circuit packages.
Figure 21:
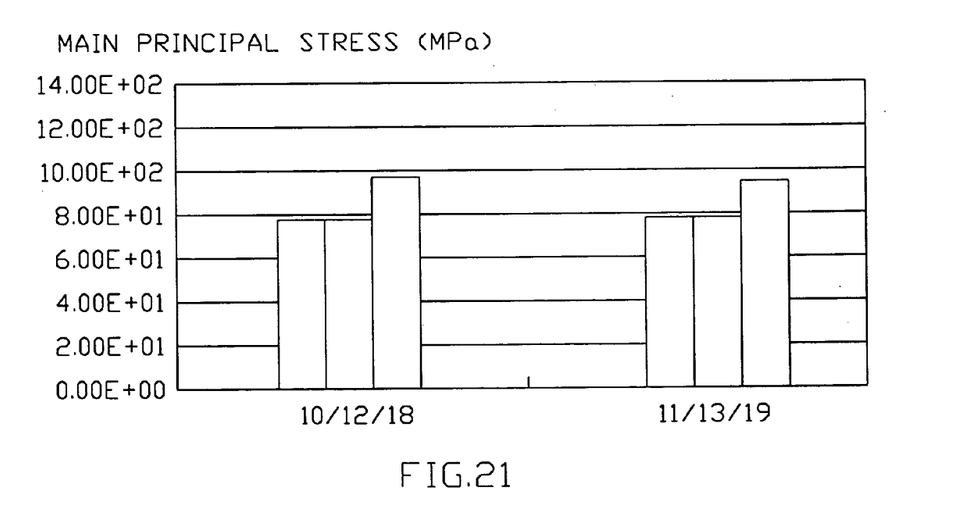
FIG. 21 is a data chart of the main principal stress of various kinds of integrated circuit packages.

The comparison of the degree of warpage between the tenth kind with the twelfth kind and the eighteenth kind, and between the eleventh kind with the thirteenth kind and the nineteenth kind of the integrated circuit package is illustrated with FIG. 20. The comparison of the main principal stress between the tenth kind with the twelfth kind and the eighteenth, kind, and between the eleventh kind with the thirteenth kind and the nineteenth kind of the integrated circuit package is illustrated with FIG. 21. The material of the balanced-parts of the tenth kind, the twelfth kind and the eighteenth kind of the integrated circuit package is copper. The material of the balanced-parts of the eleventh kind, the thirteenth kind and the nineteenth kind of the integrated circuit package is aluminum. When the chips of various kinds of the integrated circuit package are common chips, the thicker balanced-parts reduce the degree of warpage of the integrated circuit package more. Furthermore, the thicker balanced-parts reduce the degree of warpage of the integrated circuit package with the chips being stacked dies more than that of the integrated circuit package with the chips being common chips. The balanced-parts made of aluminum reduce the degree of warpage of the integrated circuit package more than the balanced-parts made of copper do. As shown in FIG. 21, the main principal stress of the integrated circuit packages with chips being stacked dies is obviously larger than the main principal stress of the integrated circuit packages with chips being common chips.

According to the preferred embodiments of the present invention, a balanced-part made of aluminum and copper reduces warpage defects of the integrated circuit package. The thicker balanced-parts mode of aluminum and copper reduce the more warpage defects of the integrated circuit package to prevent the chips from cracked and spalling. The main principal stress of the integrated circuit packages with chips being stacked dies is obviously larger than the main principal stress of the integrated circuit packages with chips being common chips. However, the degree of warpage of the integrated circuit packages with chips being stacked dies is obviously smaller than the degree of warpage of the integrated circuit packages with chips being common chips. Furthermore, the balanced-parts made of aluminum reduce more degree of warpage of the integrated circuit packages than the balanced-parts made of copper.

The present invention provides a balanced-part structure fastened on the substrate of an integrated circuit package to reduce warpage defects of the integrated circuit package. Before a heat sink is fastened or a packaging molding compound is formed inside the integrated circuit package, the balanced-parts are fastened on the substrate to balance the stress according to the amount and the weight of chips, where the chips are fastened and condition of thermal stress. The amount, the material, the weight of the balanced-parts and the positions where the balanced-parts are fastened are decided upon the best condition for balancing the stress, i.e. mechanical stress and thermal stress, of the integrated circuit package. As disclosed in one of the preferred embodiment, a substrate is defined as first portion, a second portion and a third portion. A first chip is fastened on the first portion. A second chip is fastened on the second portion. A balanced-part is fastened on the third portion. The first chip and the second chip may be a single chip or a stacked die to transmit the signals inside the integrated circuit package. The width of the third portion equals to the width consisted of the first portion and the second portion. The balanced-part is thicker than the first chip and the second chip. The balanced-part balances the stress caused from the weight of the first chip and the second chip on the substrate. The balanced-part also balances thermal stress caused by operating chips and prevents the integrated circuit package from warpage defects and the over-concentration of stress. As disclosed in another preferred embodiment, a substrate is defined as a first portion, a second portion, a third portion and a fourth portion. A first chip is fastened on the first portion. A second chip is fastened on the second portion. A first balanced-part is fastened on the third portion. A second balanced-part is fastened on the fourth portion. The first chip and the second chip may be a single die or a stacked die according to the design of the integrated circuit package to transmit the signal of the integrated circuit package. There are various kinds of the integrated circuit package including different types of chips, and different material and different size of balanced-parts to prove the affection of the present integrated circuit package with the balanced-parts. A balanced-part made of aluminum and copper reduces warpage defects of the integrated circuit package. The thicker balanced-parts mode of aluminum and copper reduce the more warpage defects of the integrated circuit package to prevent the chips from cracked and spalling. The main principal stress of the integrated circuit packages with chips being stacked dies is obviously larger than the main principal stress of the integrated circuit packages with chips being common chips. However, the degree of warpage of the integrated circuit packages with chips being stacked dies is obviously smaller than the degree of warpage of the integrated circuit packages with chips being common chips. Furthermore, the balanced-parts made of aluminum reduce more degree of warpage of the integrated circuit packages than the balanced-parts made of copper. The balanced-parts also balance thermal stress and prevent the integrated circuit package from warpage defects and the over-concentration of stress for reducing the scale and increasing the yield of the integrated circuit package.

The above description only demonstrates and illustrates the preferred embodiments of the present invention, but does not limit the scope of the present invention to what described detailed herein; and any equivalent variations and modifications of the present invention should be within the scope of the claims hereafter.

The invention claimed is:

1. An integrated circuit package with a balanced-part structure, comprising:
   a substrate having a first surface, wherein said first surface comprises a first portion, a second portion, a third portion and a fourth portion;
   a first chip fastened on said first portion of said first surface;
   a second chip fastened on said second portion of said first surface;
   a first metal balanced-part fastened on said third portion of said first surface to prevent said integrated circuit package from warpage defects caused by mechanical stress and thermal stress;
   a second metal balanced-part fastened on said fourth portion of said first surface to prevent said integrated circuit package from warpage defects caused by mechanical stress and thermal stress; and
   a packaging molding compound formed on said substrate, said first chip, said second chip, said first metal balanced-part and said second metal balanced-part to protect said first chip and second chip from damage.

2. The integrated circuit package according to claim 1, wherein said chips are stacked dies.

3. The integrated circuit package according to claim 1, wherein said metal balanced-part comprises aluminum, copper and both of them.

4. The integrated circuit package according to claim 1, wherein said first metal balanced-part is thicker than said first chip and said second chip.

5. The integrated circuit package according to claim 1, wherein said second metal balanced-part is thicker than said first chip and said second chip.

* * * * *